(12) United States Patent
Ploucha et al.

(10) Patent No.: US 8,587,246 B2
(45) Date of Patent: Nov. 19, 2013

(54) SYSTEM AND METHOD FOR ESTIMATING ELECTRICAL CURRENT IN MOTOR CONTROL CIRCUITS TO IMPROVE PERFORMANCE AND DIAGNOSTIC CAPABILITY

(75) Inventors: Joseph E Ploucha, Commerce Township, MI (US); Paul A. Bauerle, Fenton, MI (US)

(73) Assignee: GM Global Technology Operations LLC

( * ) Notice: Subject to any disclaimer, the term of this patent is extended or adjusted under 35 U.S.C. 154(b) by 0 days.

(21) Appl. No.: 13/448,826

(22) Filed: Apr. 17, 2012

(65) Prior Publication Data

US 2013/0271057 A1    Oct. 17, 2013

(51) Int. Cl.
G05B 23/02    (2006.01)

(52) U.S. Cl.
USPC .......................................................... 318/565

(58) Field of Classification Search
USPC .......................................... 318/565, 566, 560
See application file for complete search history.

(56) References Cited

U.S. PATENT DOCUMENTS

| | | | |
|---|---|---|---|
| 6,523,451 B1* | 2/2003 | Liao et al. | 91/363 R |
| 7,997,251 B2 | 8/2011 | Bauerle et al. | |
| 2008/0297078 A1* | 12/2008 | Iwasaki et al. | 318/400.02 |
| 2011/0315470 A1* | 12/2011 | Uryu | 180/446 |
| 2012/0053812 A1 | 3/2012 | Bauerle et al. | |
| 2012/0062011 A1* | 3/2012 | Jones et al. | 297/362.11 |
| 2012/0212143 A1* | 8/2012 | Esaki et al. | 315/192 |
| 2013/0026960 A1* | 1/2013 | Fujimoto et al. | 318/400.21 |

* cited by examiner

*Primary Examiner* — Lincoln Donovan
*Assistant Examiner* — Zoheb Imtiaz

(57) ABSTRACT

An error condition detection circuit coupled to the motor control circuit reports an error condition when actual motor operation deviates from predetermined desired motor operation. An overcurrent threshold comparator compares motor current with a threshold data value stored in a data storage register, and sets an overcurrent flag when the motor current exceeds the threshold. A current interrogation processor monitors the reported error condition and is programmed to respond to the error condition by iteratively reading the overcurrent flag and decrementing the overcurrent threshold data value by a predetermined decrement amount until the overcurrent flag becomes set. The current interrogation processor is further programmed to report the overcurrent threshold data value extant at the time the flag becomes set as an estimate of electric current.

18 Claims, 4 Drawing Sheets

SYSTEM AND METHOD FOR ESTIMATING ELECTRICAL CURRENT IN MOTOR CONTROL CIRCUITS TO IMPROVE PERFORMANCE AND DIAGNOSTIC CAPABILITY

FIELD

The present disclosure relates to electrical current monitoring in control circuits such as motor control circuits. More particularly the present disclosure relates to a current interrogation technique suitable for processor or microcontroller implementation within a vehicular engine control module, useful in applications such as electronic throttle motor diagnostic and control.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In diagnostic systems for electrically controlled devices employing electric motors or other actuators it can be difficult to tell the exact cause of an error condition by examining system-generated error codes alone. For example, in vehicular systems, such as automotive systems, it is common to employ control modules that record a predetermined error code upon detecting a predefined error condition. Mechanics can then review these recorded error codes as part of the diagnostic procedure. The problem with such error codes is twofold. First, available memory space and processing power is limited. Thus most systems must suffice with only a finite and often small number of recognized error conditions. Second, some error conditions are intermittent. Thus the mechanic may not be able to reproduce the reported error condition, making it difficult to discern what the cause may have been.

In electrically controlled systems employing electric motors or other electric actuators, knowing the motor or actuator current at the time an error condition occurred would be a valuable diagnostic aide in discerning the cause of the error. Unfortunately, conventional techniques for measuring current are not often practical in vehicular or automotive applications where cost, weight and system complexity must be minimized. For example, conventional techniques, such as employing a precision shunt resistor in the current path, or use of a Hall-Effect sensor to detect current flow both require an analog-to-digital convertor to convert the measured analog current value into a digital value suitable for storing in the diagnostic memory of the control module. Precision shunt resistors and Hall-Effect sensors, and the associated analog-to-digital convertors add cost, weight and complexity (more parts to fail).

SUMMARY

The system and method for estimating electrical current in motor control circuits provides a way of supplementing diagnostic error codes with current values, measured when the error condition was detected. The technique can be implemented in a non-invasive manner, requiring no additional shunt resistors, Hall-Effect sensors or associated analog-to-digital convertors. Rather, the system and method may be implemented largely by reprogramming existing system hardware, thus making the technique a desirable alternative to conventional current measurement.

The disclosed system estimates electric current flowing in a motor or actuator control circuit in the event of an error condition. As used herein, unless otherwise indicated, the term "motor" is intended to cover rotary motors, linear actuators and other devices that produce motion based on electromotive force.

In accordance with the present disclosure, an error condition detection circuit is coupled to the motor control circuit that reports an error condition when the actual motor operation deviates from a predetermined desired motor operation.

A data storage register is provided to store an overcurrent threshold data value indicative of a motor overcurrent threshold, the data storage register being initialized to a value corresponding to a predetermined upper current limit. As used herein, the term register is intended to include data storage memories built into the central processing unit (CPU) of a microprocessor or microcontroller, as well as other data storage memories external to the CPU, including but not limited to random access memory (RAM), static random access memory (SRAM), dynamic random access memory (DRAM) and other data storage mechanisms.

An overcurrent threshold comparator, coupled to the motor control circuit, senses motor current, reads the threshold data value, compares the motor current with the threshold data value and sets an overcurrent flag when motor current exceeds the motor overcurrent threshold.

A current interrogation processor is coupled to monitor the reported error condition and also monitor the overcurrent flag. The current interrogation module is programmed to operate in response to the reported error condition to iteratively read the overcurrent flag and decrement the overcurrent threshold data value by a predetermined decrement amount until the overcurrent flag becomes set by the overcurrent threshold comparator. The current interrogation module is further operable to report the overcurrent threshold data value extant at the time the overcurrent flag becomes set as an estimate of electric current flowing in the event of an error condition.

In accordance with the disclosed electric current estimating a non-transitory machine-readable memory a data storage register is defined for storing an overcurrent threshold data value and storing in said data storage register an initial overcurrent threshold data value corresponding to a predetermined upper current limit.

The method involves sensing an electric current flowing in the motor control circuit, reading the overcurrent threshold data value and comparing the sensed electric current with the overcurrent threshold data value and setting an overcurrent flag when the electric current flowing in the motor control circuit exceeds the overcurrent threshold data value.

Then, while continuing to compare the sensed electric current with the overcurrent threshold data value, the method further involves detecting an error condition by sensing operating parameters within the motor control circuit, and upon detecting of said error condition, performing the steps of:

(a) iteratively reading the overcurrent flag, and (b) decrementing the overcurrent threshold data value by a predetermined decrement amount until the overcurrent flag becomes set;

(c) reporting the overcurrent threshold data value extant at the time the overcurrent flag becomes set as an estimate of electric current flowing in the motor control circuit.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The system and method for estimating electrical current in motor control circuits can be implemented in a variety of different applications. For illustration purposes an electronically controlled throttle of an automotive vehicle will be featured in this description. It will be understood that the techniques described here are applicable to other types of motor control circuits as well. The illustrated technique for estimating electrical current is applied to improve the reliability and analysis of faulted electronic throttle control (ETC) systems, by expanding the utility of existing software and motor control hardware capabilities within the vehicular engine control modules (ECMs). When applied as described here, the technique provides specific ranges of electric current flowing through the electronic throttle motor control circuitry.

A typical ECM electronic throttle motor control circuitry includes an H-bridge driver IC, a DC brush motor within a throttle body assembly, serial communication to the H-bridge driver, miscellaneous filtering hardware, diagnostic circuits, voltage monitoring, temperature monitoring, vehicle wiring and electrical connectors. The system and method for estimating electrical current augments this motor control circuitry to provide additional current measuring and reporting capability, as will now be described.

Figure 1:
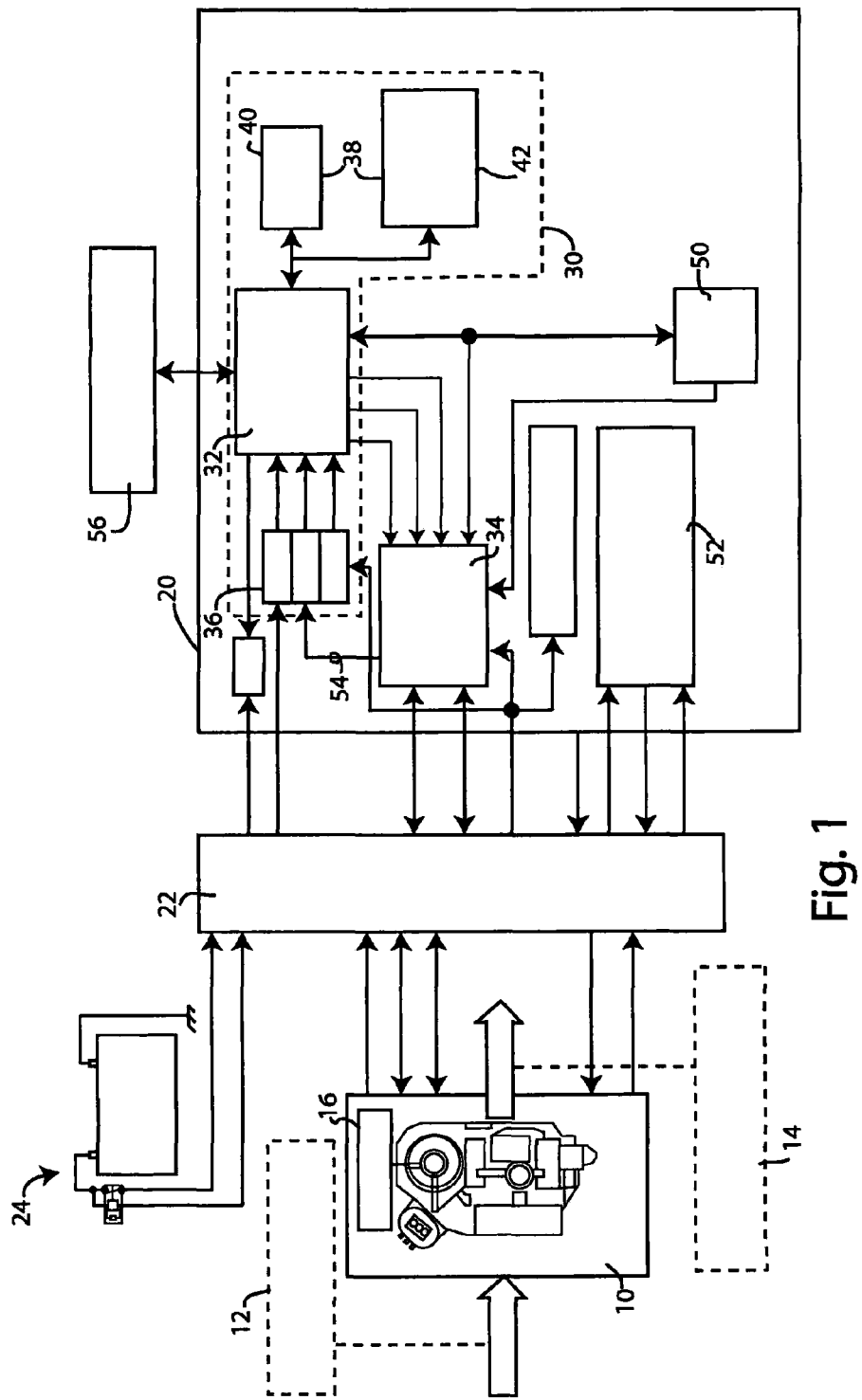
FIG. 1 is an electronic circuit diagram illustrating an exemplary vehicular engine control module in which the system and method of estimating electrical current is implemented.

Accordingly, FIG. 1 shows an electronic throttle body 10 having an airflow induction subsystem that includes airbox and sensors 12 and intake manifold and sensors 14. The electronic throttle body 10 preferably includes a DC brush motor 16, shown diagrammatically. The motor 16 is operable to drive the throttle in both open and closed directions. The motor 16 is driven by an electronic throttle control circuit (ETC) 20, which supplies a pulse-width modulated voltage to energize the motor. The electronic throttle control circuit 20 is coupled through conventional connectors and wiring harness 22. DC power for operating the electronic throttle control circuit 20 (and motor 16) is provided by the vehicle's power supply system 24.

One preferred system for estimation of electrical current in the motor control circuit uses some components found within the electronic throttle control circuit 20. Thus, a further overview of the internal components of the electronic throttle control circuit 20 will now be presented.

The electronic throttle control circuit 20 includes a microcontroller 30 (shown generally in dotted lines). The microcontroller 30 includes a main hardware input/output (HWIO) module 32 that coordinates interaction with the H-bridge driver IC, which may be implemented, for example, as an application specific integrated circuit (ASIC) 34. Microcontroller 30 also includes a bank of input circuitry 36 including individual input capture (IC) data lines and also an analog-to-digital conversion channel (ADC). A main function of microcontroller 30 is to implement a set of control functions that operate various monitoring and control processes applicable to electronic throttle control. More specifically, microcontroller 30 implements these multiple control functions as a collection of processing sequences called rings that typically run as continuous loops, running through a programmed sequence and then repeating. When executed by the microcontroller hardware, each ring thus defines one of a collection of processing modules shown collectively at 38.

The throttle position software ring (TPSR) is most relevant here. The throttle position software ring defines a throttle position processing module 40 that calculates the desired throttle position. To simplify illustration, the remainder of the processing modules implemented by microcontroller 30 have been collectively depicted at 42.

During operation, the throttle position processing module 40 communicates with the main HWIO module 32 to send motor direction signals (MTR_DIR 1/MTR_DIR 2) to the H-bridge ASIC 34. The signals thus select which direction the motor 16 should turn (to move the throttle in a more open or more closed direction). The main HWIO module 32 also supplies a pulse width modulation (PWM) signal to the H-bridge ASIC 34 to control the duty cycle of the motor drive signal. The pulse width modulation signal effectively controls the speed of the rotation of the motor 16. Other configurations are possible.

The microcontroller 30 also includes a motor process monitor module 50 that serially communicates with the main HWIO module 32 and with the H-bridge ASIC 34. Microcontroller 30 also includes a voltage conditioning and supply module 52 that supplies power to the electronic throttle body 10 (via TPS_VSD, TPS_RTN).

The electronic throttle body control system operates in closed loop. A throttle position sensor on the throttle body 10 provides a position signal (TPS1_2) that is fed through the connectors and wiring harness 22 to one of the input capture (IC) nodes of input circuitry 36, where that signal is supplied to the main HWIO module 32. The throttle position processing module 40 compares the sensed throttle position with the calculated desired throttle position and, from this calculation, generates control signals to adjust the throttle position by applying pulse width modulated DC power to the motor 16, as needed. Other configurations are possible. For example, analog throttle position data comprising two discrete analog signals TPS1 and TPS2 may be processed in a manner identical to TPS1_2 once digitized by the main controller.

When everything is operating normally, the closed loop system maintains the desired throttle position at all times. If mechanical issues exist that prevent the throttle from moving to the desired position in a responsive manner, the throttle position processing module 40 takes initial corrective action by allowing an increased level of current to flow through motor 16. In some instances this may be effective to dislodge a sticking part or obstruction.

To prevent motor overheating or burnout, the throttle position processing module 40 is further designed to sense overcurrent conditions and shut off power to the motor if currents become too high. Processing module 40 performs this function in cooperation with the H-bridge ASIC 34, which supplies an overcurrent signal on line 54 (i.e, a motor overcurrent signal), and is coupled through input circuitry 36 to the main HWIO module 32. The conventional operation of the main HWIO module is to provide an operator indication as at 56, such as in the form of a diagnostic code to record the general nature of the fault. Heretofore, however, there has been no cost effective way to monitor and report the amount of the overcurrent flowing when the fault was detected.

The technique disclosed here provides a quantitative measure of the amount of current flowing through the motor when an overcurrent condition is sensed. It does so in a minimally invasive, cost effective manner which allows the technique to be applied with very few hardware modifications to existing circuitry. Thus, the technique is well-suited to mass produced products, such as automotive vehicles, where hardware modification can be prohibitively expensive.

Figure 2:
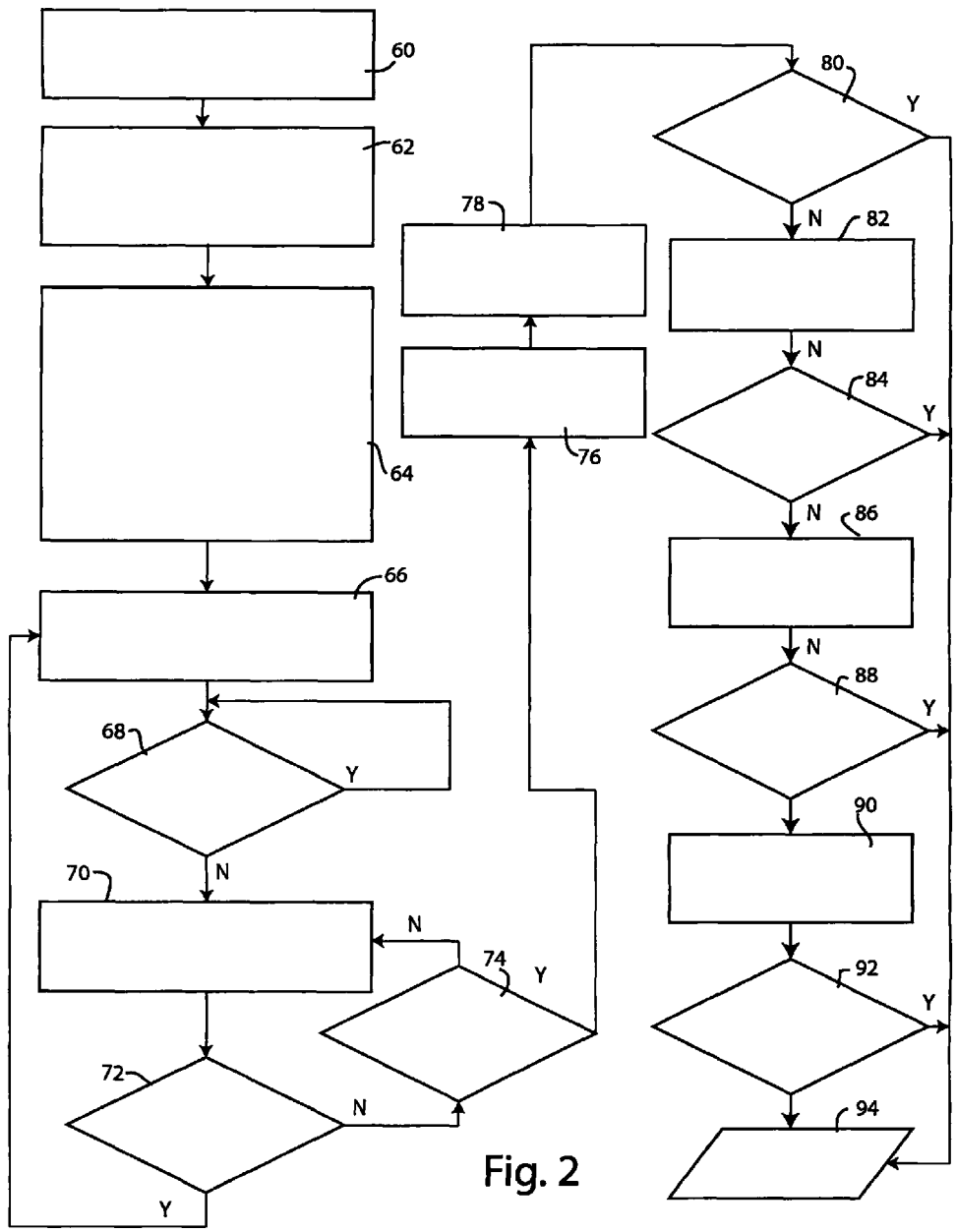
FIG. 2 is a flowchart diagram depicting the throttle position control algorithm and ladder-style current interrogation technique in accordance with the system and method for estimating electrical current.

More specifically, the system and method for estimating electrical current is implemented by modifying the HWIO module 32 and by providing the throttle position processing module 40 with additional program instructions to effect the current monitoring algorithm illustrated in FIG. 2.

Referring now to FIG. 2, one algorithm for estimating electrical current in the motor control circuit will now be described. The process begins at 60 where the main HWIO module 32 is initiated along with other initialization sequences within the electronic throttle control. As part of the initialization sequence, the H-bridge ASIC is set to initialize its overcurrent threshold to a predetermined value, typically to a value above 7.3 A at 62. For example, the overcurrent threshold value may be initialized at 8.6 A. In this regard, it will be understood that the overcurrent threshold set at this step is selected to represent the upper end of the operating current range.

Next, at step 64 microcontroller 30 is initialized by identifying which motor control diagnostics shall be enabled for the device. In conventional fashion, these diagnostics are designated by P-codes, corresponding to different types of faults.

After the above initialization steps, motor control is executed at 66. Once motor control has commenced, microcontroller 30 begins processing each of the steps of its respective processing modules 38 (FIG. 1), including steps of the throttle position software ring (processing module 40) and the steps of the other software rings (processing modules 42). The throttle position software ring is relevant here and thus the basic steps of that ring are illustrated in FIG. 2 at 68. Essentially, the throttle position software ring at 68 tests whether the indicated throttle position is equal to the desired throttle position. If so, then the control simply loops back and continues to monitor throttle position.

In the event the indicated throttle position does not equal the desired throttle position then corrective action is taken by increasing the motor pulse width modulation at step 70 to 100% maximum modulation while incrementing appropriate error flags and timers. In this regard a timer is used to determine if the error condition clears or persists after a predetermined time interval.

Driving the motor at 100% maximum PWM applies a burst of energy to the motor which, in some cases, may free up a mechanical obstruction, allowing the motor to again drive the throttle to its desired position. If the increased jolt of energy is successful in freeing the fault condition, the algorithm at 72 branches control back to step 66 where the operation continues as normal. However, if the indicated throttle position is not equal to the desired throttle position at 72, a test is performed at 74 to detect whether the timer corresponding to the error condition has elapsed thus signaling that the corresponding error has matured. If the motor is still operating within established thresholds, then control branches at 74 back to step 70 where the pulse width modulation is again increased to 100% maximum, whereupon the illustrated cycle repeats.

Ultimately, if the indicated throttle position does not equal the desired throttle position, then a mature error condition is signaled, whereupon at step 74, control branches to set the appropriate P-codes at 76 and to read the status of the overcurrent flag at 78. It will be recalled that the status of the overcurrent flag is read via line 54 (FIG. 1) using one of the input capture circuits 36 read by the main HWIO module 32.

At this point, the algorithm departs from conventional practice and implements a ladder-style current interrogation procedure depicted in steps 80 through 94. The ladder-style current interrogation technique works by successively decrementing the current limit value used by the H-bridge ASIC 34 and then testing to see whether the overcurrent flag has been set. Thus, for example, the decision step 80 is true (Y) if the overcurrent flag set above 8.6 amps. If the decision step 80 is not true (N), step 82 is performed whereby the overcurrent limit is decremented by a predetermined amount resulting in the overcurrent limit being set to 6.6 amps. In a similar fashion, step 84 tests whether the overcurrent flag set above 6.6 amps; step 86 decrements the overcurrent limit to 4.0 amps; step 88 tests whether the overcurrent flag set above 4.0 amps; step 90 decrements the overcurrent limit to 2.0 amps; and step 92 tests whether the overcurrent flag set above 2.0 amps.

Once the overcurrent flag is detected as having been set, the current limit value stored in the H-bridge ASIC is then copied to or stored in a "current range" register at step 94. In the illustrated embodiment, three current limit decrement stages have been illustrated. These effectively provide four levels of current measuring granularity. Of course, if a finer degree of resolution is required, additional stages may be added to the ladder algorithm.

The process depicted in FIG. 2 can be implemented using different portions of the electric throttle control module 20. In the preferred embodiment illustrated in FIG. 1, the main HWIO module 32 and the throttle position processing module 40 handle much of the processing, with some involvement by the H-bridge ASIC 34. Processes within these two subsystems read and write data values from memory locations or storage registers within the main HWIO module and H-bridge ASIC, respectively.

Figure 3:
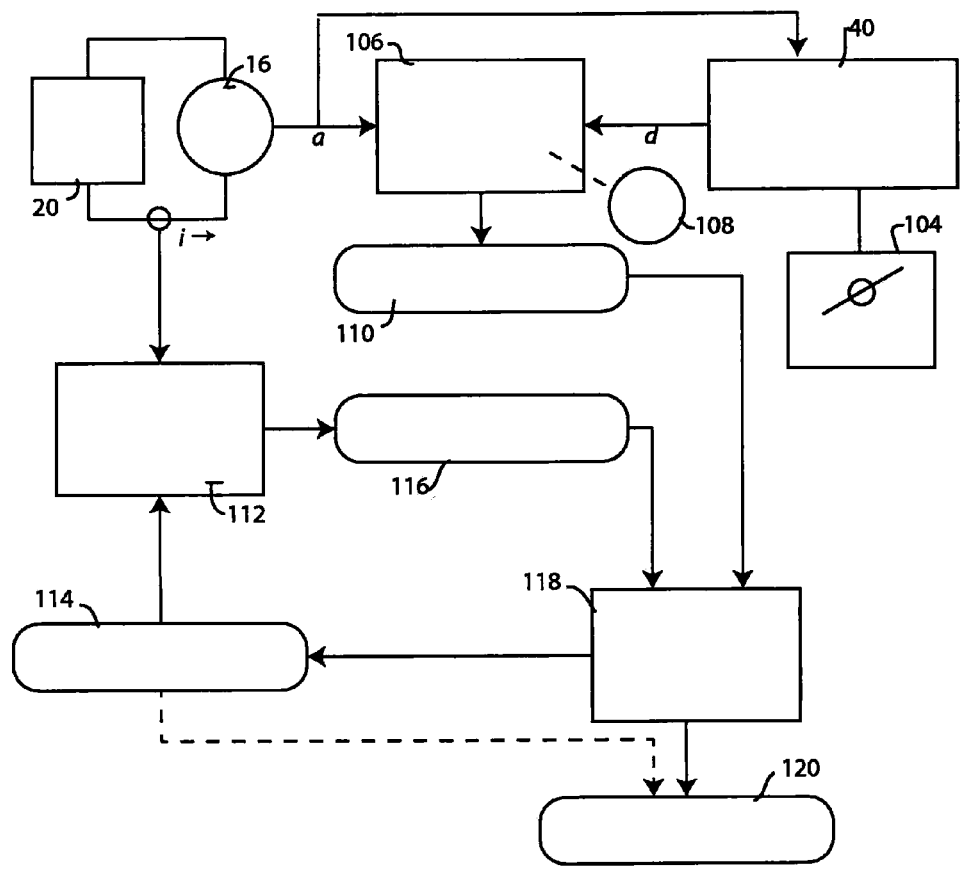
FIG. 3 is a functional system block diagram of one embodiment of a system for estimating electrical current.

FIG. 3 illustrates one implementation of the system for estimating electric current flowing in a motor control circuit 20 which includes motor 16. In FIG. 3, the electric current is depicted as current I, which may be the actual current flowing through motor 16, or may be another measurable value related to or indicative of motor current. During normal operation the motor position processing module 40 controls the position of actuator 104 in closed loop fashion. In this example the actuator is a throttle, although other motor-controlled actuators may be similarly controlled in accordance with the teachings herein. The motor position processing module compares the actual motor position (or actual actuator position a) with a desired position d, as set by the operational needs of the position control algorithm. The difference between desired condition and actual condition is monitored by the error condition detection circuit 106, which includes an associated timer 108. If the desired condition and actual condition deviate by a predetermined amount for a predetermined time interval measured by timer 108, the error condition detection circuit 106 sets an error condition flag 110. This flag may be stored as a Boolean value (yes-no value) in a suitable non-transitory machine readable memory or register allocated within the memory of the microcontroller 30 (FIG. 1).

Meanwhile an overcurrent threshold comparator circuit 112 monitors the electric current i flowing in the motor control circuit 20 and compares that measured value with an overcurrent threshold data value which is stored in a suitable non-transitory machine readable memory or register 114, also allocated within the memory of the microcontroller 30. As will be appreciated from a study of FIG. 2, previously discussed, this overcurrent threshold data value is subject to change as the system operates. The overcurrent threshold comparator operates to set an overcurrent flag 116, upon detecting that the actual current i exceeds the overcurrent threshold data value. The overcurrent flag may also be stored in a suitable non-transitory machine readable memory or register allocated within the memory of the microcontroller 30.

The current interrogation processor 118, monitors the state of the error condition flag 110 and the state of the overcurrent flag 116. When the error condition flag indicates that an error condition exists (actual actuator position does not match desired position for the duration of the timer interval), the current interrogation module checks the overcurrent flag 116 to determine if it is also set.

If so, the current interrogation processor copies the overcurrent threshold data value stored in register 114 into a suitable non-transitory machine readable memory or register 120 also allocated within the memory of the microcontroller 30 to represent the reported estimated current. The current interrogation processor records this value as the estimated electric current flowing in the motor control circuit, and may associate that value with a predefined P-code error code corresponding to the detected error condition. In this way, a mechanic can examine the P-code and the corresponding reported estimated current and determine more about the cause of the error condition.

If the overcurrent flag 116 is not set when the error condition flag is set, the current interrogation module decrements the value stored in the overcurrent threshold data value 114 and the overcurrent threshold comparator 112 and current interrogation processor 118 continue to cooperate by successively lowering and testing the overcurrent threshold in stages until the overcurrent flag is finally set. In this way, the system iteratively tests at different current levels until the current corresponding to the error condition is discovered.

Figure 4:
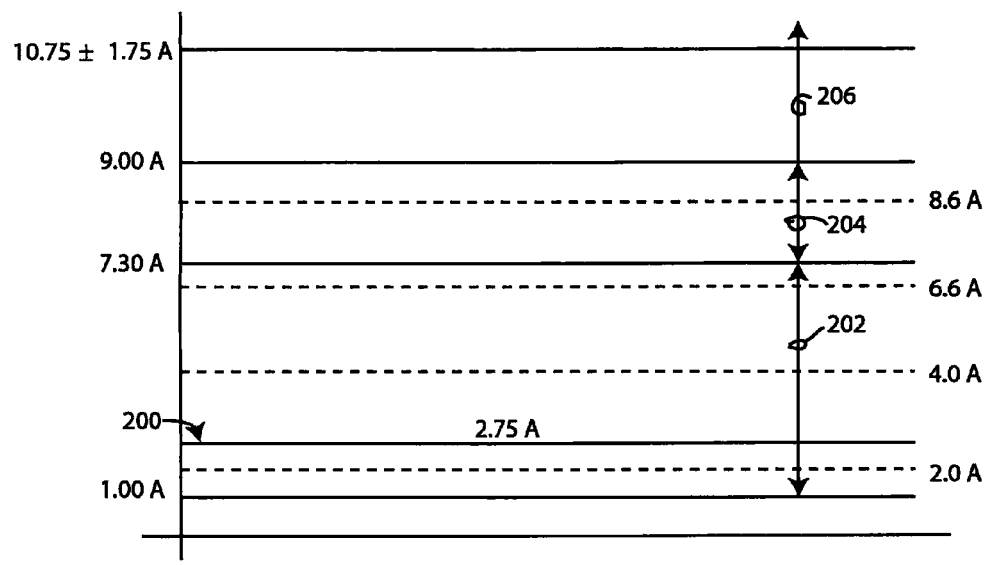
FIG. 4 is a graphical depiction of the system and method for estimating electrical current in operation.

FIG. 4 illustrates how the current estimation algorithm performs in an exemplary embodiment utilizing four sequentially tested current limits, that is, a ladder-style current interrogation process having four stages. It will, of course, be understood that a different embodiment may implement a different number of stages. Generally, the number of stages is dictated by the size of the predetermined decrement amount and by the overall operating current range of the system. That is, the predetermined decrement amount is sized to subdivide the current flow operating range of the motor control circuit into a predetermined integer number of stages, each stage corresponding to a different reported estimated current.

In FIG. 4 as indicated at 200, a typical motor current might be on the order of 2.75 A. The normal operating range might be between 1.0 A and 7.3 A, as depicted at 202. In the range depicted at 204, the motor current is above the normal operating range but still within a range where the motor may be operated, with some current limiting being imposed. The range depicted at 206 corresponds to the region in which current may be considered excessive. Thus, 9.0 A would represent the low limit of permissible thermal shutdown, with 10.75 A representing the permissible thermal shutdown point.

Superimposed upon these ranges are dashed lines corresponding to current measurement points of 2.0 A, 4.0 A, 6.6 A and 8.6 A, which are examples for a typical H-bridge ASIC; different H-bridge ASIC's may have different values. These four measurement points correspond to the four values that would be successively stored in the current limit register as the ladder process 104 operates. Because the ladder process decrements the current limit 108 as it moves through the ladder stages, the motor current is first tested to see whether it exceeds 8.6 A. If not, it is next tested to see if it exceeds 6.6 A, and then 4.0 A, and then finally 2.0 A.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A system for estimating electric current flowing in a motor control circuit in the event of an error condition, comprising:

an error condition detection circuit coupled to the motor control circuit that reports an error condition when actual motor operation deviates from a predetermined desired motor operation;

a data storage register storing an overcurrent threshold data value indicative of a motor overcurrent threshold, the data storage register being initialized to a value corresponding to a predetermined upper current limit;

an overcurrent threshold comparator coupled to the motor control circuit that senses motor current, reads the threshold data value, compares the motor current with the threshold data value, and sets an overcurrent flag when the motor current exceeds the motor overcurrent threshold; and a current interrogation processor coupled to monitor the reported error condition and the overcurrent flag and programmed to operate in response to the reported error condition to iteratively read the overcurrent flag and decrement the overcurrent threshold data value by a predetermined decrement amount until the overcurrent flag becomes set by the overcurrent threshold comparator, the current interrogation processor being further programmed to report the overcurrent threshold data value extant at the time the overcurrent flag becomes set as an estimate of electric current flowing in the event of an error condition.

2. The system of claim 1 wherein the error condition detection circuit includes a timer and reports an error condition when the actual motor operation deviates from the predetermined desired motor operation for a predetermined time interval measured by the timer.

3. The system of claim 1 wherein the error condition detection circuit monitors position of an actuator controlled by the motor control circuit and wherein the error condition detection circuit reports the error condition when the monitored actuator position deviates from a predetermined desired actuator position.

4. The system of claim 1 wherein the error condition detection circuit monitors position of an actuator controlled by a motor within the motor control circuit and wherein the system further comprises an actuator position processor programmed to enable an increase in delivery of energy to the motor when the monitored actuator position deviates from a predetermined desired actuator position.

5. The system of claim 4 wherein the actuator position processor enables the increase in delivery of energy by increasing the duty cycle of a pulse-width modulated motor drive current supplied to the motor.

6. The system of claim 1 wherein the current interrogation processor is programmed to:
(a) copy the overcurrent threshold data value to a non-transitory machine-readable memory storage register representing the reported estimated current if the overcurrent flag is set, and
(b) decrement the overcurrent threshold data value by the predetermined decrement amount if the overcurrent flag is not set.

7. The system of claim 1 wherein the predetermined decrement amount is sized to subdivide the current flow operating range of the motor control circuit into a predetermined integer number of stages, each stage corresponding to a different reported estimated current.

8. The system of claim 1 wherein the motor control circuit is a component of a vehicular electronic throttle control system.

9. The system of claim 1 wherein the motor control circuit is a component of a vehicular control system of the type that reports a predefined error code in the event of an operational error and wherein the system for estimating electric current is configured to associate with the predefined error code the report of the overcurrent threshold data value extant at the time the overcurrent flag becomes set.

10. A method of estimating electric current flowing in a motor control circuit in the event of an error condition, the method comprising:
defining in a non-transitory machine-readable memory a data storage register for storing an overcurrent threshold data value;
storing in the data storage register an initial overcurrent threshold data value corresponding to a predetermined upper current limit;
sensing an electric current flowing in the motor control circuit;
reading the overcurrent threshold data value;
comparing the sensed electric current with the overcurrent threshold data value and setting an overcurrent flag when the electric current flowing in the motor control circuit exceeds the overcurrent threshold data value; and
while continuing to compare the sensed electric current with the overcurrent threshold data value, detecting an error condition by sensing operating parameters within the motor control circuit, and upon detection of the error condition, performing the steps of:
(a) iteratively reading the overcurrent flag,
(b) decrementing the overcurrent threshold data value by a predetermined decrement amount until the overcurrent flag becomes set, and
(c) reporting the overcurrent threshold data value extant at the time the overcurrent flag becomes set as an estimate of electric current flowing in the motor control circuit.

11. The method of claim 10 wherein the error condition is detected by sensing operating parameters within the motor control circuit and reporting an error condition when actual motor operation deviates from a predetermined desired motor operation for a predetermined time interval.

12. The method of claim 10 wherein the error condition is detected by sensing position of an actuator controlled by the motor control circuit and reporting an error condition when the sensed actuator position deviates from a predetermined desired actuator position.

13. The method of claim 10, further comprising monitoring the position of an actuator controlled by a motor within the motor control circuit and enabling the increase in delivery of energy to a motor when the monitored actuator position deviates from a predetermined desired actuator position.

14. The method of claim 13 wherein the increase in delivery of energy is enabled by increasing the duty cycle of a pulse-width modulated motor drive current supplied to the motor.

15. The method of claim 10 wherein the steps (a), (b), and (c) are performed by a processor executing instructions causing the processor to:
copy the overcurrent threshold data value to a non-transitory machine-readable memory storage register representing the reported estimated current if the overcurrent flag is set, and
decrement the overcurrent threshold data value by the predetermined decrement amount if the overcurrent flag is not set.

16. The method of claim 10 further comprising sizing the predetermined decrement amount to subdivide the current flow operating range of the motor control circuit into a predetermined integer number of stages, each stage corresponding to a different reported estimated current.

17. The method of claim 10 wherein the motor control circuit is a component of a vehicular electronic throttle control system.

18. The method of claim 10 wherein the motor control circuit is a component of a vehicular control system of the type that reports a predefined error code in the event of an operational error and wherein the method further comprises associating and reporting the predefined error code with the reporting of the overcurrent threshold data value extant at the time the overcurrent flag becomes set.

* * * * *